US012660157B2

(12) United States Patent
Feng

(10) Patent No.: US 12,660,157 B2
(45) Date of Patent: Jun. 16, 2026

(54) SEMICONDUCTOR DEVICE AND METHOD OF FORMING THE SAME

(71) Applicant: Fujian Jinhua Integrated Circuit Co., Ltd., Quanzhou City (CN)

(72) Inventor: Li-Wei Feng, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 382 days.

(21) Appl. No.: 18/424,841

(22) Filed: Jan. 28, 2024

(65) Prior Publication Data

US 2025/0203845 A1 Jun. 19, 2025

(30) Foreign Application Priority Data

Dec. 19, 2023 (CN) .......................... 202311768772.5

(51) Int. Cl.
*H10B 12/00* (2023.01)
*G11C 5/10* (2006.01)

(52) U.S. Cl.
CPC .............. *H10B 12/31* (2023.02); *G11C 5/10* (2013.01); *H10B 12/03* (2023.02)

(58) Field of Classification Search
CPC ................................... H05K 1/11; H05K 1/14
USPC .......... 361/764, 767, 782–784, 803; 365/72, 365/148–149
See application file for complete search history.

(56) References Cited

U.S. PATENT DOCUMENTS

| | | | |
|---|---|---|---|
| 8,082,524 B2 | 12/2011 | Gleason | |
| 11,226,552 B2 | 1/2022 | Ahn | |
| 11,404,538 B2 * | 8/2022 | Park | H10B 12/315 |
| 11,610,898 B2 | 3/2023 | Yoon | |
| 2004/0004257 A1 * | 1/2004 | Lee | H10B 12/033 |
| | | | 257/E21.59 |
| 2007/0160918 A1 | 7/2007 | Kosa | |
| 2015/0380415 A1 * | 12/2015 | Yoon | H10B 12/34 |
| | | | 438/618 |
| 2017/0098601 A1 | 4/2017 | Lim | |
| 2022/0406791 A1 * | 12/2022 | Kim | H10B 12/485 |

(Continued)

FOREIGN PATENT DOCUMENTS

| | | |
|---|---|---|
| CN | 110231753 A | 9/2019 |
| CN | 112731761 A | 4/2021 |

(Continued)

*Primary Examiner* — Tuan T Dinh
(74) *Attorney, Agent, or Firm* — Winston Hsu

(57) ABSTRACT

A semiconductor device includes a substrate, plugs and a storage node pad structure. The storage node pad structure includes first, second and third extension pads and a margin extension pad. The first extension pads are separately arranged as an array and electrically connected with the plugs. The margin extension pad is disposed outside the first extension pads. The second and third extension pads are disposed between the margin extension pad and the plurality of first extension pads. Maximum distances to a nearest lateral side of the margin extension pad from an end of the second extension pad and from an end of the third extension pad are equal. Included angles between the lateral side of the margin extension pad and respective shorter sides of the second and third extension pads are both less than 90 degrees. Accordingly, the semiconductor device has improved device reliability.

20 Claims, 10 Drawing Sheets

(56)       References Cited

U.S. PATENT DOCUMENTS

2023/0298999 A1* 9/2023 Ahn .................... H10W 10/014
257/213

FOREIGN PATENT DOCUMENTS

KR     10-2022-0047469 A     4/2022
WO       2005083515 A1     9/2005

* cited by examiner

SEMICONDUCTOR DEVICE AND METHOD OF FORMING THE SAME

BACKGROUND OF THE INVENTION

1. Field of the Invention

The present invention generally relates to a semiconductor device and a method of forming the same, and more particularly, to a semiconductor device including an extension pad, and a method of forming the same.

2. Description of the Prior Art

With the trend of miniaturization of various electronic products, the design of semiconductor devices must also meet the requirements of high integration and high density. Under the current mainstream of development trend, dynamic random access memories (DRAMs) having recessed gate structures have gradually replaced the DRAMs having only planar gate structures due to longer carrier channel length for the same semiconductor substrate so as to reduce current leakage of capacitor structures. In general, a DRAM cell with a recessed gate structure includes a transistor component and a charge storage device to receive voltage signals from bit lines and word lines. However, due to the limitations of current processing technologies, there are still many defects in currently available DRAM cells with recessed gate structures, which need to be further improved to effectively improve the performance and reliability of related memory devices.

SUMMARY OF THE INVENTION

An object of the present invention is to provide a semiconductor device, in which the semiconductor device can have improved device reliability and achieve excellent operational performance by forming a specific extension pad with extended length.

Another object of the present invention is to provide a method of forming a semiconductor device, in which a length of a specific extension pad can be extended by additionally forming a block pattern. Accordingly, the method of forming a semiconductor device facilitates formation of a semiconductor device with improved device reliability so as to achieve excellent operational performance.

In order to achieve the above object, an embodiment of the present invention provides a semiconductor device, which includes a substrate, a plurality of plugs and a storage node pad structure. The plurality of plugs are disposed on the substrate. The storage node pad structure is disposed on the substrate and includes a plurality of first extension pads, a margin extension pad, a plurality of second extension pads and a plurality of third extension pads. The plurality of first extension pads are separated from each other and arranged as an array, wherein the plurality of first extension pads are electrically connected with the plurality of plugs, respectively. The margin extension pad is disposed outside the plurality of first extension pads. The plurality of second extension pads are disposed between the margin extension pad and the plurality of first extension pads. The plurality of third extension pads are disposed between the margin extension pad and the plurality of first extension pads. A maximum distance from an end of one of the plurality of second extension pads to a lateral side of the margin extension pad, which is nearest to the end, is equal to a maximum distance from an end of one of the plurality of third extension pads to the lateral side of the margin extension pad. A first included angle between a shorter side of one of the plurality of second extension pads and the margin extension pad is less than 90 degrees, and a second included angle between a shorter side of one of the plurality of third extension pads and the margin extension pad is less than 90 degrees.

In order to achieve the above object, an embodiment of the present invention provides a method of forming a semiconductor device, which includes providing a substrate and forming a plurality of plugs on the substrate. A storage node pad structure is further formed on the substrate. The storage node pad structure includes a plurality of first extension pads, a margin extension pad, a plurality of second extension pads and a plurality of third extension pads. The plurality of first extension pads are separated from each other and arranged as an array, wherein the plurality of first extension pads are electrically connected with the plurality of plugs, respectively. The margin extension pad is disposed outside the plurality of first extension pads. The plurality of second extension pads are disposed between the margin extension pad and the plurality of first extension pads. The plurality of third extension pads are disposed between the margin extension pad and the plurality of first extension pads. A maximum distance from an end of one of the plurality of second extension pads to a lateral side of the margin extension pad, which is nearest to the end, is equal to a maximum distance from an end of one of the plurality of third extension pads to the lateral side of the margin extension pad.

Generally, in a semiconductor device and a method of forming the same according to the present invention, a length of a specific extension pad is extended by forming an additional block pattern, so that each extension pad in the storage region can have a complete contour. In this way, a semiconductor device according to the present invention can have improved component reliability and achieve excellent operational performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 3 to FIG. 6 are schematic diagrams illustrating a method of forming the semiconductor device according to the second embodiment of the present invention, wherein:

FIG. 3 is a schematic top view schematically illustrating the semiconductor device after a first self-aligned reverse pattering process is performed;

FIG. 4 is a schematic top view schematically illustrating the semiconductor device after a second self-aligned reverse patterning process is performed;

FIG. 5 is a schematic top view schematically illustrating the semiconductor device after block patterns are formed in the peripheral region; and FIG. 6 is a schematic top view schematically illustrating the semiconductor device after block patterns are formed in the storage region.

FIG. 8 is a schematic top view of a semiconductor device according to a third embodiment of the present invention.

FIG. 10 is a schematic top view of a semiconductor device according to a fifth embodiment of the present invention.

DETAILED DESCRIPTION

For better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
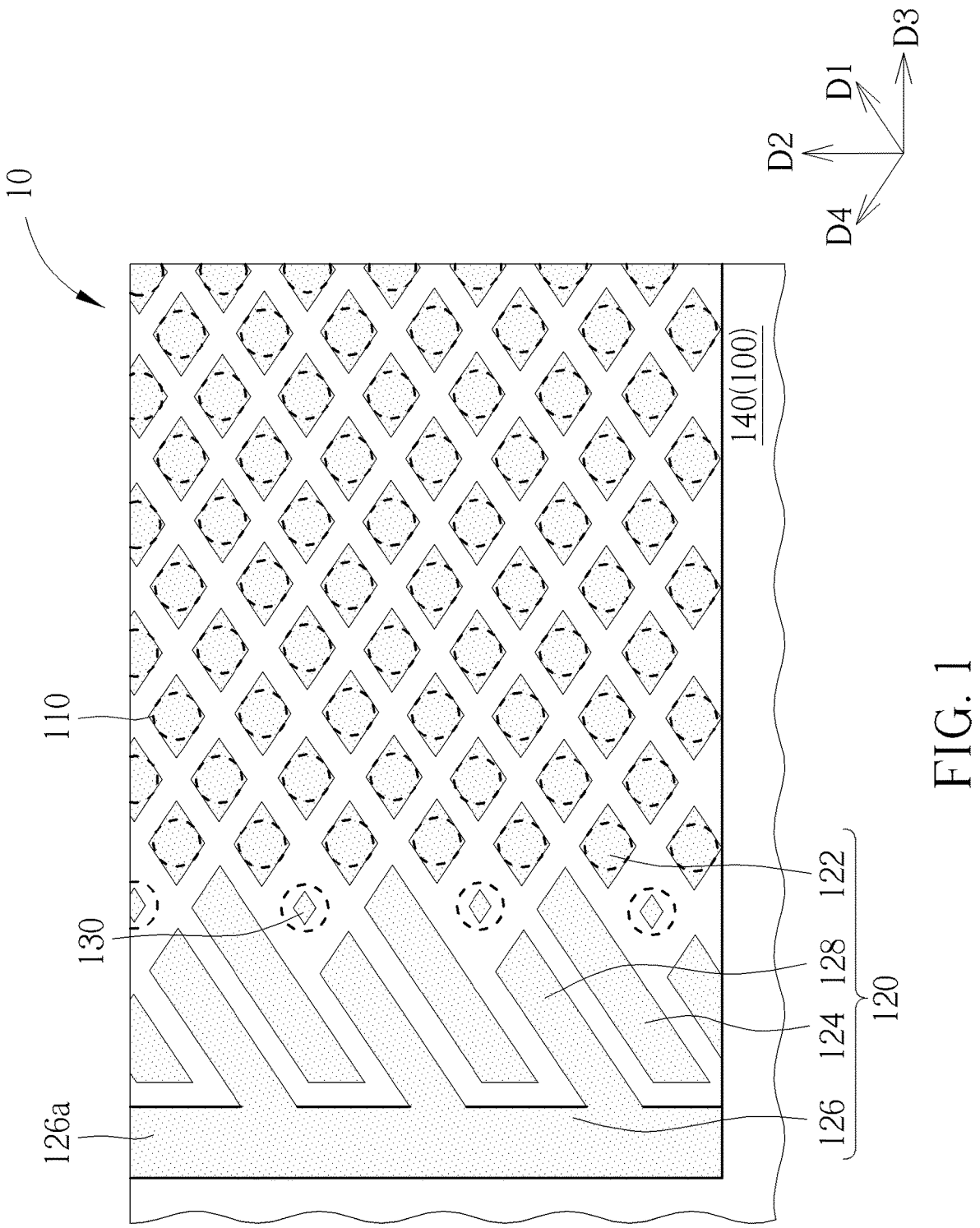
FIG. 1 is a schematic top view of a semiconductor device according to a first embodiment of the present invention.

Please refer to FIG. 1, which is a schematic diagram illustrating a semiconductor device 10 according to a first embodiment of the present invention. The semiconductor device 10 includes a substrate 100, a plurality of plugs 110 and a storage node (SN) pad structure 120. The substrate 100, for example, may be a silicon substrate, a silicon-containing substrate, e.g., SiC or SiGe, a silicon-on-insulator (SOI) substrate, or a substrate formed of any other suitable material, but it is not limited thereto. The plugs 110 are disposed on the substrate 100 and contain conductive material for electric connection to a plurality of active areas (not shown) disposed in the substrate 100. In an embodiment, the conductive material includes an epitaxial material such as silicon (Si), silicon phosphorus (SiP), silicon germanium (SiGe) or germanium (Ge), or a low-resistance metal material such as aluminum (Al), titanium (Ti), copper (Cu) or tungsten (W), but it is not limited thereto. The storage node pad structure 120 is disposed on the substrate 100 and includes a plurality of first extension pads 122, a plurality of second extension pads 124, a margin extension pad 126 and a plurality of third extension pads 128.

In detail, the first extension pads 122 are separated from each other and arranged as an array along a first direction D1 and a fourth direction D4 intersecting the first direction D1, and each of the first extension pads 122 is electrically connected with one of the plugs 110 disposed thereunder. The margin extension pad 126 is disposed outside the first extension pads 122, the second extension pads 124 and the third extension pads 128, and includes at least a first border 126a extending along a second direction D2. The second extension pads 124 and the third extension pads 128 are disposed between the margin extension pad 126 and the first extension pads 122. The second extension pads 124 are not in contact with the first border of the margin extension pad 126, while the third extension pads 128 are in physical contact with the first border of the margin extension pad 126. Furthermore, the third extension pads 128 and the second extension pads 124 are arranged alternately at an interval in the second direction D2. In an embodiment, the margin extension pad 126 further includes a second border (not shown), which extends along a third direction D3 perpendicular to the second direction D2, in addition to the first border, so as to integrally surround the first extension pads 122, the second extension pads 124 and the third extension pads 128. However, it is not limited thereto.

Referring to FIG. 1 again, the semiconductor device 10 further includes a dielectric layer 140 disposed around the storage node pad structure 120 on the substrate 100, and located among the first extension pads 122, the second extension pads 124, the third extension pads 128 and the margin extension pad 126 for electrically insulating the components. In an embodiment, the dielectric layer 140 may include, but be not limited to, an insulating material such as silicon oxide, silicon nitride or silicon oxynitride. In this way, the semiconductor device 10 in this embodiment can have good performance. Those of ordinary skill in the art would easily understand that although the storage node pad structure 120 is disposed on the substrate 100, various components such as transistor components, word line components and/or bit line components, may be arranged between the storage node pad structure 120 and the substrate 100 or in the substrate 100 according to actual requirements. Furthermore, a capacitor structure (not shown) electrically connected to the first extension pads 122 may be further arranged above the storage node pad structure 120, so as to form a dynamic random access memory (DRAM) device to achieve good device performance. However, it is not limited thereto.

Those of ordinary skill in the art would easily understand that for complying with practical needs, the semiconductor device according to the present invention may have a variety of embodiments in addition to the above-described ones. For example, the storage node pad structure 120 may be produced by a self-aligned reverse patterning (SARP) process. Unfortunately, during fabrication, some of the first extension pads, e.g., extension pads 130 adjacent to the margin extension pad 126, may suffer from contour defects such as shrinkage deformation, as shown in FIG. 1, due to factors such as optical proximity effect (OPE) or pattern alignment error. Under this circumstance, the DRAM cells subsequently disposed on the first extension pads 130 are prone to structural problems such as peeling off or collapse. Therefore, in another embodiment of the present invention, a semiconductor device 20 is provided, in which the contour defects of extension pads can be effectively ameliorated, thereby avoiding structural problems such as peeling off or collapse occurring in the DRAM cells. Other embodiments or variations of the semiconductor device according to the present invention will be further described hereinafter. For simplification purpose, the following descriptions mainly focus on the differences among embodiments, and the similarities will not be repetitively described. In addition, the same components in various embodiments of the present invention are labeled with the same reference numerals, in order to facilitate mutual comparison among various embodiments.

Figure 2:
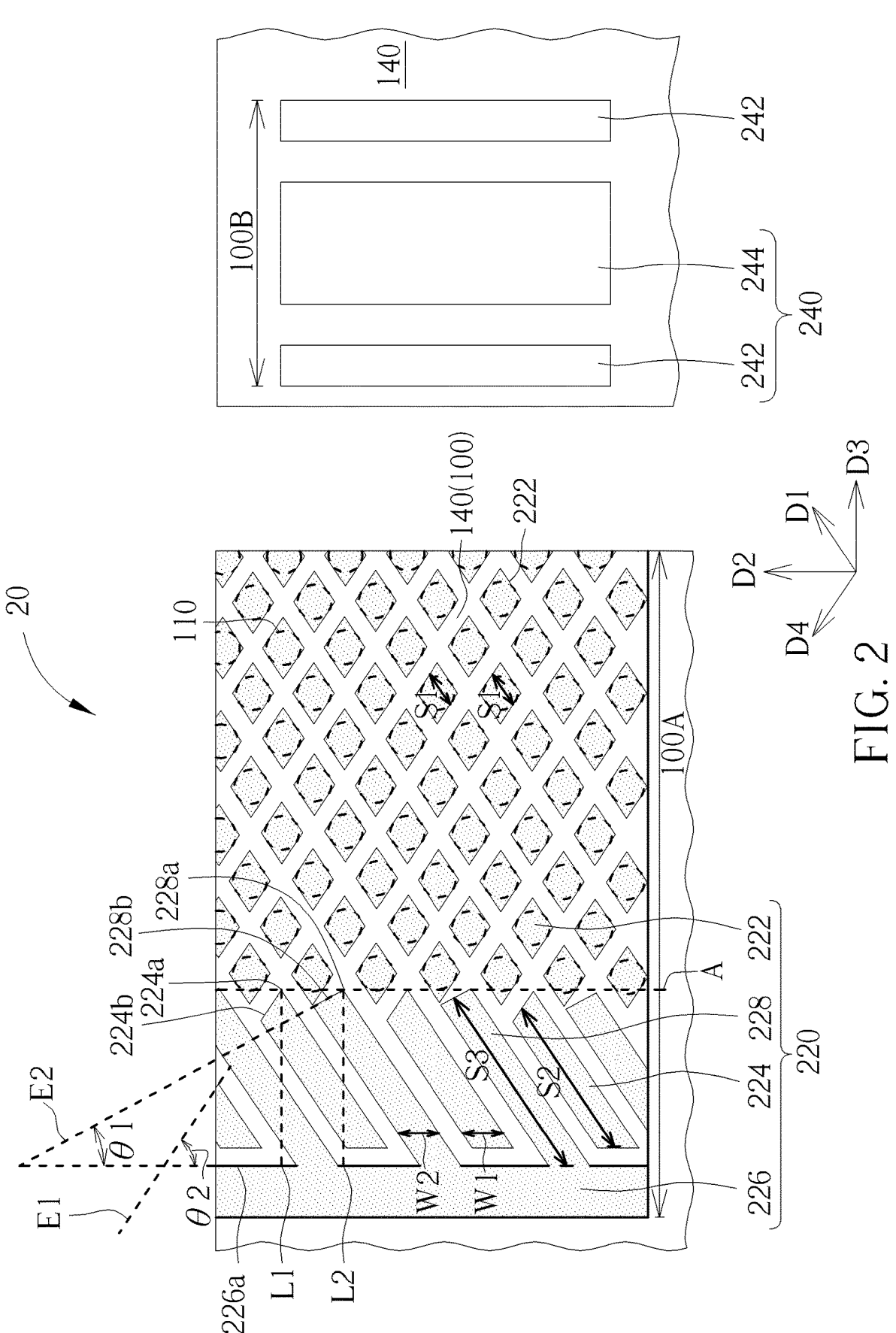
FIG. 2 is a schematic top view of a semiconductor device according to a second embodiment of the present invention.

Please refer to FIG. 2, which is a schematic diagram illustrating the semiconductor device 20 in the second embodiment of the present invention. The semiconductor device 20 also includes a substrate 100, a plurality of plugs 110 and a storage node pad structure 220. The specific features and functions of the substrate 100, the plug 110 and other components are the same as those described in the first embodiment, and will not be repeated herein.

The storage node pad structure 220 in this embodiment is also disposed on the substrate 100 and includes a plurality of first extension pads 222, a plurality of second extension pads 224, a margin extension pad 226 and a plurality of third extension pads 228. The first extension pads 222 are separated from each other and arranged as an array along the first direction D1 and the fourth direction D4 intersecting the first direction D1, and each of the first extension pads 222 is electrically connected with one of the plugs 110 disposed thereunder. The margin extension pad 226 is disposed outside the first extension pads 222, and the second extension pads 224 and the third extension pads 228 are disposed between the margin extension pad 226 and the first extension pads 222, being separated from each other and extending along the first direction D1. It is to be noted that the maximum distance L1 from an end 224a of the second extension pads 224 to a lateral side 226a of the margin extension pad 226 nearest to the end 224a is equal to the maximum distance L2 from an end 228a of the third extension pads 228 to the lateral side 226a of the margin extension pad 226. Meanwhile, a first included angle θ1 between a shorter side 224b of the second extension pad 224 and the lateral side 226a of the margin extension pad 226 is less than 90 degrees. Likewise, a second included angle θ2 between a shorter side 228b of the third extension pad 228 and the lateral side 226a of the margin extension pad 226 is also less than 90 degrees, as shown in FIG. 2. In other words, the ends 224a and 228a of the second extension pads 224 and the third extension pads 228 can be made aligned with each other by extending the length S3 of the third extension pads 228 in the first direction D1. In this way, all the first extension pads 222 arranged inside the third extension pads 228 can have complete contours, so that the semiconductor device 20 in this embodiment has improved component reliability and achieves excellent operational performance.

In detail, as shown in FIG. 2, the margin extension pad 226 also includes a first border extending along the second direction D2, and the second extension pads 224 and the third extension pads 228 are both disposed between the first border of the margin extension pad 226 and the first extension pads 222. Furthermore, the third extension pads 228 and the second extension pads 224 are arranged alternately at an interval in the second direction D2. It is to be noted that the first extension pads 222 have the same length S1 in the first direction D1, and the second extension pads 224, which are not in contact with the margin extension pad 226, have a length S2 in the first direction D1, which is an average length of two longer sides thereof in the first direction D1. The length S2 of the second extension pads 224 is greater than the length S1 of the first extension pads 222 and less than the length S3 of the third extension pads 228, which are in physical contact with the margin extension pad 226, wherein the length S3 is an average length of two longer sides thereof extending in the first direction D1. In other words, since the third extension pads 228 have a relatively long length S3, the ends 224a and 228a of the second extension pads 224 and the third extension pads 228, which have different lengths S2 and S3 extending along the same direction D1, can be aligned with each other and lie on the same cut line A. Under this configuration, ends of the first extension pads 222, which are close to the shorter side 224b of the second extension pad 224 or the shorter side 228b of the third extension pad 228, may also be aligned with each other, as shown in FIG. 2. Furthermore, the first extension pads 222 can have complete contours. Notably, the first extension pads 222 adjacent to the third extension pads 228 can have the same sizes and shapes as the other first extension pads 222.

It is to be further noted that in an embodiment, the longer sides of the second extension pads 224 and the third extension pads 228 are parallel to each other in the first direction D1, while the shorter sides 224b of the second extension pads 224 and the shorter sides 228b of the third extension pads 228 extend respectively in different directions E1 and E2, which are not parallel to each other. Accordingly, the first included angle θ1 between the shorter side 224b of the second extension pad 224 and the lateral side 226a of the margin extension pad 226 is not equal to the second included angle θ2 between the shorter side 228b of the third extension pad 228 and the lateral side 226a of the margin extension pad 226. The extending direction E1 of the shorter side 224b is, for example, parallel to the fourth direction D4, while the extending direction E2 of the shorter side 228b is neither parallel nor perpendicular to the fourth direction D4, as shown in FIG. 2. However, it is not limited thereto. Furthermore, in an embodiment, a width W2 of the third extension pad 228 in the second direction D2 may be, but not limited to be, optionally greater than a width W1 of the second extension pad 224 in the second direction D2.

Refer to FIG. 2 again. The substrate 100 includes a storage region 100A provided for disposing therein storage components and a peripheral region 100B provided for disposing therein other components, e.g., transistor components. The above-mentioned plugs 110 and storage node pad structure 220 are basically disposed in the storage region 100A, so that the first extension pads 222 of the storage node pad structure 220 correspond to the storage array of the subsequently formed storage components. In this embodiment, the semiconductor device 20 further includes a wiring structure 240 in the peripheral region 100B of the substrate 100 and a dielectric layer 140 surrounding the storage node pad structure 220 and the wiring structure 240. The wiring structure 240 includes a plurality of first conductive wires 242 and a plurality of second conductive wires 244, which extend in the second direction D2 in parallel to each other, while being allocated alternately along the third direction D3 perpendicular to the second direction D2. In an embodiment, the storage node pad structure 220 and the wiring structure 240 may, but not limited to, contain the same metal material, e.g., a low-resistance metal material such as aluminum, titanium, copper or tungsten. The dielectric layer 140 is disposed on the substrate 100 and distributed among the first extension pads 222, the second extension pads 224, the third extension pads 228 and the margin extension pad 226 of the storage node pad structure 220 and the first conductive wires 242 and the second conductive wires 244 of the wiring structure 240 for electric insulation of the components. In an embodiment, the dielectric layer 140 contains an insulating material, for example but not limited to, silicon oxide, silicon nitride or silicon oxynitride.

Under the afore-mentioned configurations, the semiconductor 20 according to the second embodiment of the present invention may have the second extension pads 224 and the third extension pads 228, which have different lengths S2 and S3, aligned with each other by elongating the third extension pads 228 in the first direction D1. The first extension pads 222 disposed adjacent to the third extension pads 228 can thus have complete contours. In this way, the semiconductor device 20 in this embodiment has improved component reliability and achieves excellent operational performance. In addition, Those of ordinary skill in the art can easily understand that various components such as transistor components, word line components and/or bit line components may be arranged between the storage node pad structure 220 and the substrate 100 or in the substrate 100 according to the actual requirements. Moreover, a capacitor structure (not shown) electrically connected to the first extension pads 222 may be, but not limited to be, further arranged above the storage node pad structure 220, thereby forming the dynamic random access memory device and achieving further improved performance of the device.

In order to make those having ordinary skills in the art easily understand the semiconductor device 20 according to the present invention, a method of forming the semiconductor device 20 according to the present invention will be further described as follows.

Figure 3:
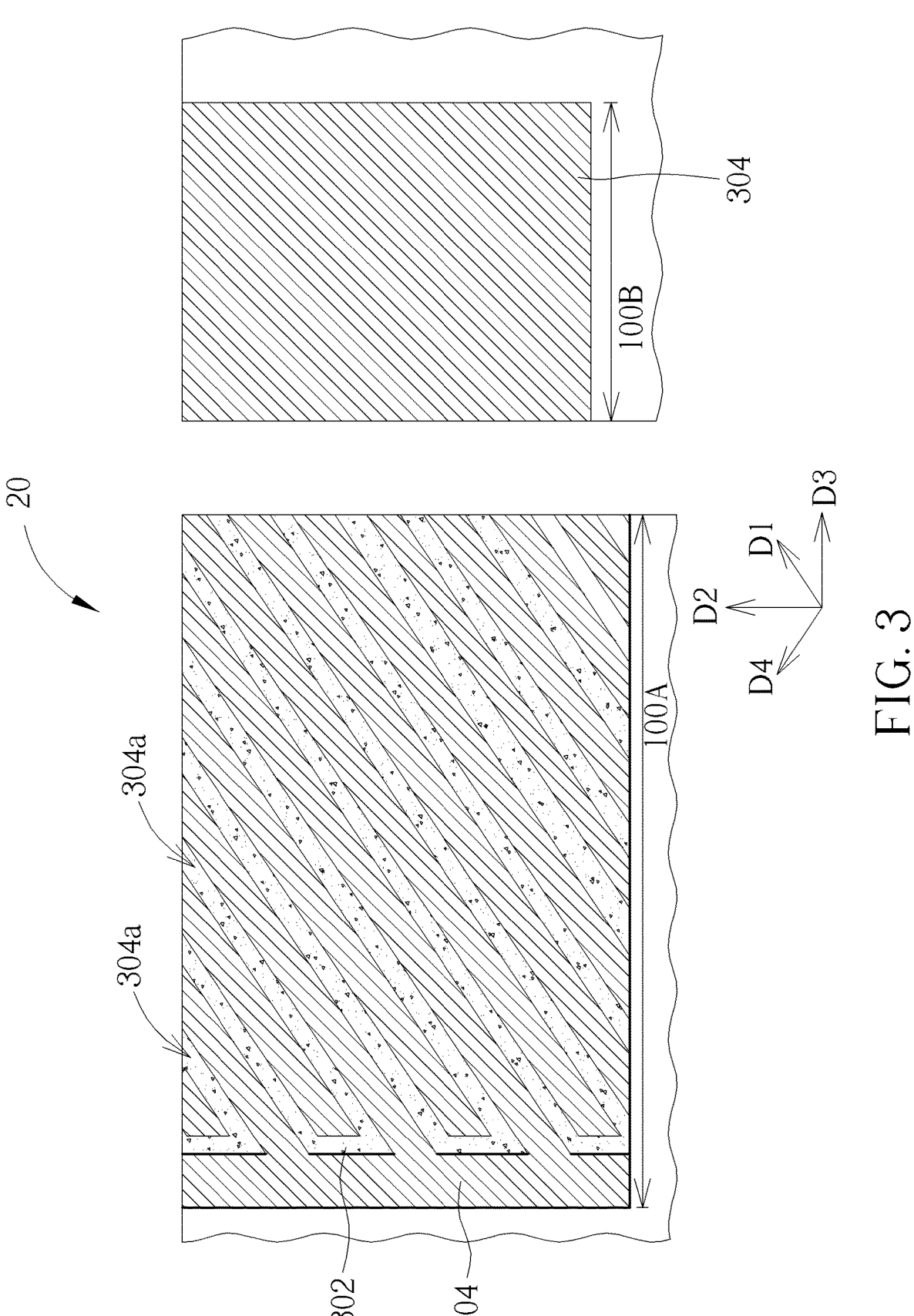

Please refer FIG. 3 to FIG. 6, which are schematic diagrams illustrating a method of forming the semiconductor device according to the second embodiment of the present invention. First of all, a substrate 100 is provided. As shown in FIG. 3, a conductive material layer (not shown), a hard mask layer 302 (nor shown in FIG. 3) and a first mask layer 304 are sequentially formed on the substrate 100 and overlie the storage region 100A and the peripheral region 100B of the substrate 100 as a whole. In an embodiment, the conductive material layer, for example, contains a low-resistance metal material such as aluminum, titanium, copper or tungsten. The hard mask layer 302, for example, contains a proper mask material such as amorphous silicon. The first mask layer 304, may, but not limited to, contain a mask material such as silicon nitride or silicon carbonitride. Afterwards, a first self-aligned reverse patterning process is performed on the first mask layer 304 to form a plurality of first openings 304a with rectangular frames in the storage region 100A, wherein the first openings 304a are separated from each other and extend along the first direction D1, and the underlying hard mask layer 302 is exposed from each of the first openings 304a.

Figure 4:
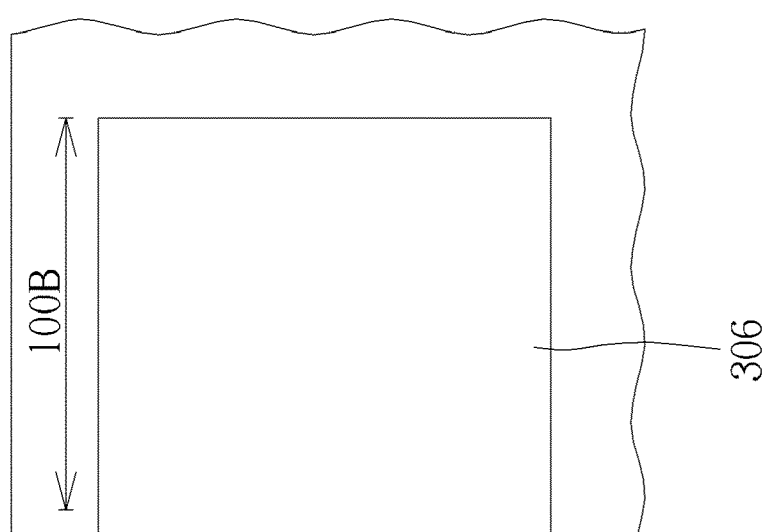
Figure 5:
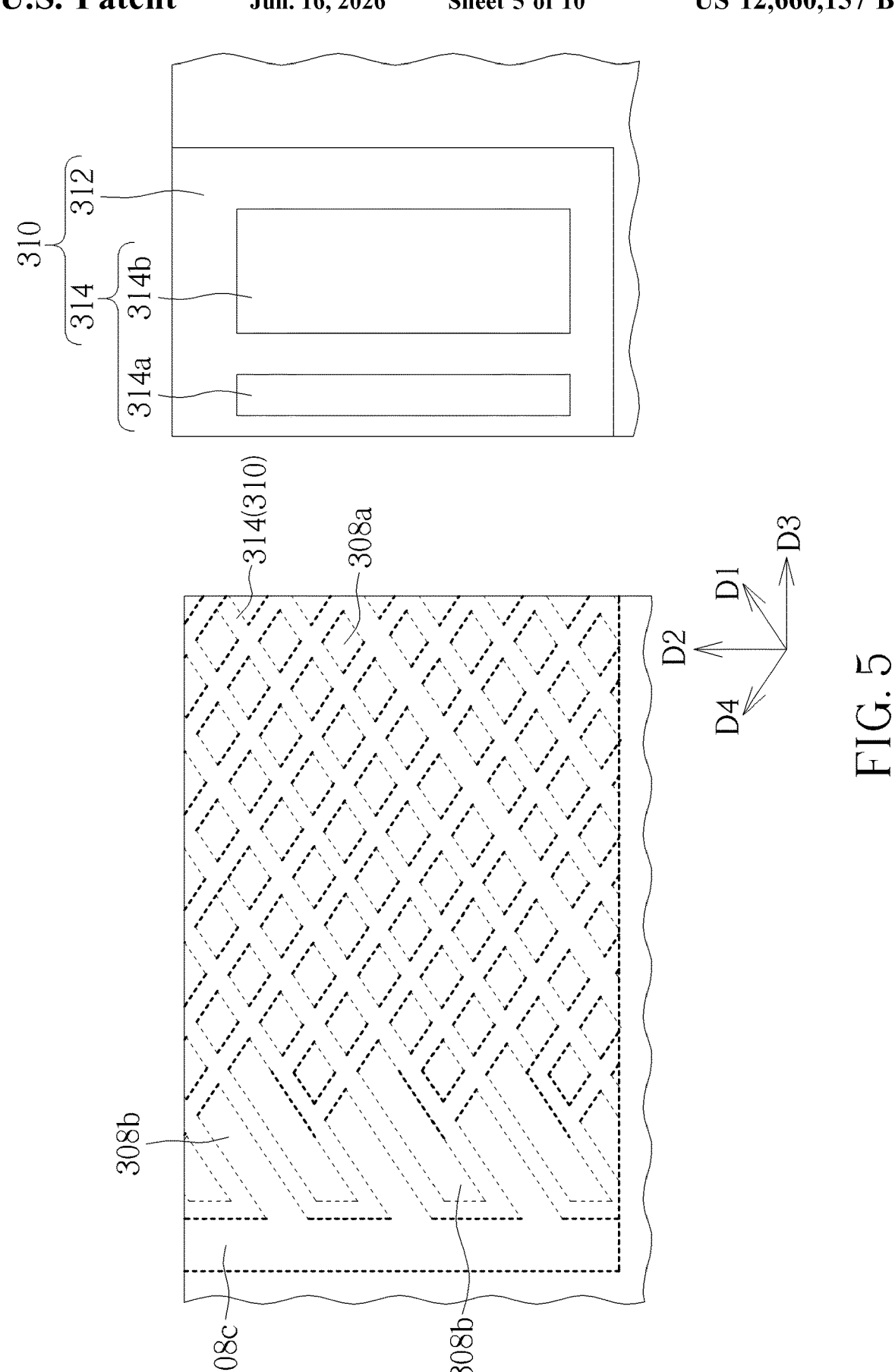

Subsequently, as shown in FIG. 4, a second mask layer 306 is formed on the first mask layer 304. A second self-aligned reverse patterning process is performed on the second mask layer 306 and the underlying first mask layer 304, thereby forming a plurality of second openings 306a with rectangular frames in the storage region 100A, wherein the second openings 306a interleave with the first openings 304a disposed thereunder. In an embodiment, the second mask layer 306 may also, but not limited to, contain a mask material such as silicon nitride or silicon carbonitride. The second openings 306a are separated from each other and extend along the fourth direction D4, and also expose therefrom the underlying hard mask layer 302. Through the two self-aligned reverse patterning processes, a plurality of first mask patterns 308a, a plurality of second mask patterns 308b and a third mask pattern 308c are formed on the second mask layer 306 and/or the first mask layer 304, as shown in FIG. 5. The first mask patterns 308a are separated from each other and arranged as an array along the first direction D1 and the fourth direction D4. The third mask pattern 308c is disposed at a side of the first mask patterns 308a and extends along the second direction D2. The second mask patterns 308b are disposed between the first mask patterns 308a and the third mask pattern 308c, partially in physical contact with the third mask pattern 308c and extending along the first direction D1. On the other hand, no opening or pattern is formed on the second mask layer 306 in the peripheral region 100B.

Figure 6:
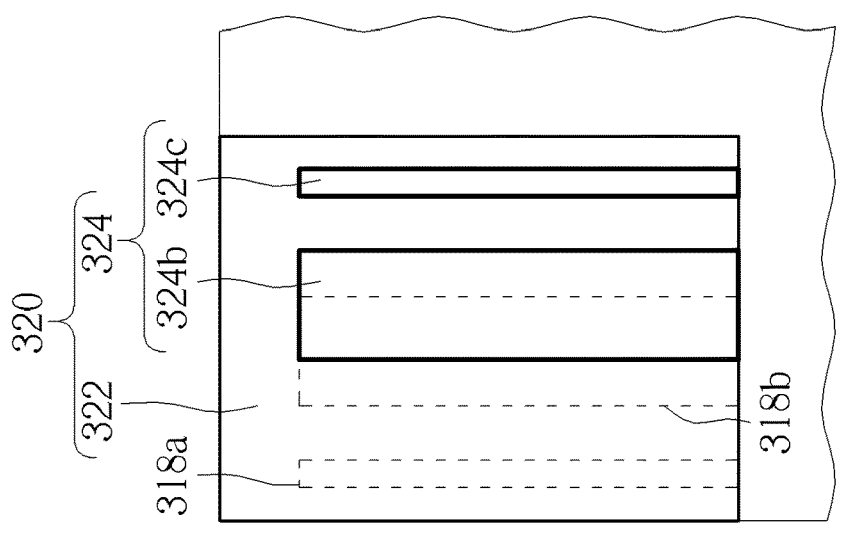

As shown in FIG. 5, a mask structure 310 is formed on the substrate 100, overlying the second mask layer 306. The mask structure 310 preferably has a composite structure, which may, but not limited to, include an organic bottom layer (not shown), a silicon hard mask bottom anti-reflective coating layer 312 and a mask layer 314 stacked in sequence. The mask layer 314 overlies the entire storage region 100A of the substrate 100, and meanwhile, is defined with a plurality of block patterns 314a and 314b extending along the second direction D2 in the peripheral region 100B. Subsequently, through an etch process performed with the mask structure 310, the block patterns 314a and 314b are transferred to the underlying first mask layer 304 to form a plurality of fourth mask patterns 318a and 318b as shown in FIG. 6. The mask structure 310 is then completely removed.

Then, as shown in FIG. 6, a mask structure 320 is formed on the substrate 100. Likewise, the mask structure 320 preferably has a composite structure, which may, but not limited to, include an organic bottom layer (not shown), a silicon hard mask bottom anti-reflective coating layer 322 and a mask layer 324 stacked in sequence. The mask layer 324 is defined with a plurality of first block patterns 324a extending along the first direction D1 in the storage region 100A, and meanwhile, is defined with a plurality of second block patterns 324b and 324c extending along the second direction D2 in the peripheral region 100B. The shorter sides of the first block patterns 324a may, but not limited to, extend in a direction E2, as shown in FIG. 6, wherein the direction E2 is neither parallel not perpendicular to the fourth direction D4. It is to be noted that each of the first block patterns 324a in the storage region 100A simultaneously covers the third mask pattern 308c, one of the second mask patterns 308b and one of the first mask patterns 308a in the first direction D1. In detail, the first block pattern 324a covers entirely the second mask pattern 308b, which is in physical contact with the third mask pattern 308c and the adjacent first mask pattern 308a. On the other hand, the second block pattern 324b in the peripheral region 100B partially covers the underlying mask pattern 318b, while the second block pattern 324c does not cover the underlying mask patterns 318a and 318b.

Subsequently, another etching process is performed through the first block patterns 324a, the first mask patterns 308a, the second mask patterns 308b and the third mask pattern 308c to transfer the first block patterns 324a and the underlying first mask patterns 308a, second mask patterns 308b and third mask pattern 308c in the storage region 100A all to the hard mask layer 302 in the storage region 100A, and then further to the underlying metal material layer. Likewise, through the second block patterns 324b and 324c and the underlying fourth mask patterns 318a and 318b of the mask structure 320, the second block patterns 324b and 324c and the underlying fourth mask patterns 318a and 318b in the peripheral region 100B are all transferred to the hard mask layer 302 in the peripheral region 100B in this etching process, and then further transferred to the underlying metal material layer. In other words, the storage node pad structure 220 as shown in FIG. 2 can be formed in this etching process by etching the metal material layer in the storage region 100A through the first block patterns 324a, the first mask patterns 308a, the second mask patterns 308b and the third mask pattern 308c. Meanwhile, the wiring structure 240 as shown in FIG. 2 can be formed in the common etching process by etching the metal material layer in the peripheral region 100B through the second block patterns 324b and 324c and the underlying fourth mask patterns 318a and 318b. After the storage node pad structure 220 and the wiring structure 240 are formed, the mask structure 320 is completely removed, and dielectric material (not shown) is formed on the substrate 100. By performing a planarization process, the dielectric layer 140 surrounding the storage node pad structure 220 and the wiring structure 240 can be obtained. The dielectric layer 140 surrounds the storage node pad structure 220 and the wiring structure 240 in a manner as exemplified in FIG. 2, but it is not limited thereto.

In an embodiment, a width of each of the first block patterns 324a in the extension direction E2 is preferably greater than or equal to a width of the underlying first mask pattern 308a, and/or it is preferably greater than or equal to a width of the underlying second mask pattern 308b, so that the first block pattern 324a can cover entirely the underlying first mask pattern 308a and/or second mask pattern 308b. However, it is not limited thereto. For example, if the optical proximity effect occurs during the above two self-aligned reverse patterning processes, some first mask patterns 308a may have contour defects such as shrinkage deformation, and the width of each of the first mask patterns 308a in the extension direction E2 may be smaller than that of the remaining first mask patterns 308a, and smaller than that of the second mask patterns 308b. Under this circumstance, the first block patterns 324a may effectively cover the underlying first mask patterns 308a and second mask patterns 308b, and the width W2 of the subsequently formed third extension pads 228 in the second direction D2 may be greater than the width W1 of the second extension pads 224 accordingly. However, in another embodiment (not shown), the width of the first block patterns in the extension direction E2 may be selected to be less than or equal to the width of the underlying first mask patterns 308a, or less than or equal to the width of the underlying second mask patterns 308b. In this way, the first block patterns can only cover partially the first mask patterns 308a and the second mask patterns 308b disposed thereunder. In a subsequent process, third extension pads having relatively high roughness of sidewalls are formed (not shown). For example, the roughness is higher than the roughness of sidewalls of the second extension pads 224. Alternatively, third extension pads having relatively small width in the second direction D2 are formed (not shown). For example, the width is less than the width of the second extension pads 224.

The method according to this embodiment includes two self-aligned reverse patterning processes to commonly define the mask patterns 308a, 308b and 308c of the extension pads. Furthermore, while the wiring structure is additionally defined in the peripheral region 100B, the first block patterns 324a may be simultaneously formed in the storage region 100A, each covering one of the first mask patterns 308a corresponding to one of the first extension pads 222, and covering one of the second mask patterns 308b corresponding to a peripheral extension pad. It is to be noted that the first block patterns 324a do not cover entirely the margin extension pad 226, and do not cover the second extension pads 224, which are not in contact with the margin extension pad 226. Therefore, the subsequently formed third extension pads 228 may have an additionally extended length S3 to be aligned with the subsequently formed second extension pads 224, thereby effectively maintaining the complete contours of the first extension pads 222 adjacent to the third extension pads 228. In this way, all the first extension pads 222 adjacent to the third extension pads 228 in the first direction D1 may have complete contours. Therefore, the method in this embodiment can effectively ameliorate the contour defects of the extension pads, form the semiconductor device 20 with improved component reliability, and achieve excellent operational performance.

Those of ordinary skill in the art would easily understand that although the storage node pad structure 220 is disposed on the substrate 100, various components such as transistor components, word line components and/or bit line components, may be arranged between the storage node pad structure 220 and the substrate 100 or in the substrate 100 according to actual requirements. In other words, the following steps may be, but not limited to be, performed before forming the storage node pad structure 220. For example, a shallow trench isolation (not shown) may be further formed in the substrate 100. Subsequently, a buried gate structure (not shown) is formed in the substrate 100. The buried gate structure is disposed in the storage region 100A and functions as a buried word line of the semiconductor device 20. Then, a plurality of bit lines (not shown) and a plurality of plugs 110 are formed on the substrate 100. The bit lines and the plugs 110 are alternately arranged with each other and also disposed in the storage region 100A. Although the buried word line and the bit lines are not specifically depicted in the drawings of this embodiment, those of ordinary skill in the art would easily understand that the bit lines are parallel to each other and extend in a direction perpendicular to the buried word line, i.e., the gate structure. The bit lines are electrically connected to the substrate 100 through respective bit line contacts (BLC, not shown) disposed thereunder, and electrically insulated from the buried word line in the substrate 100 through an insulating layer (not shown) overlying the top surface of the substrate 100. The insulating layer may, but not limited to, include a silicon oxide-nitride-oxide structure. Then the above-described process is performed to form the storage node pad structure 220 and the dielectric layer 140, wherein the first extension pads 222 are in physical contact with the plugs 110, respectively. Furthermore, a capacitor structure (not shown) electrically connected to the first extension pads 222 may be further arranged above the storage node pad structure 220, so as to form a dynamic random access memory (DRAM) device to achieve good device performance. However, it is not limited thereto.

Figure 7:
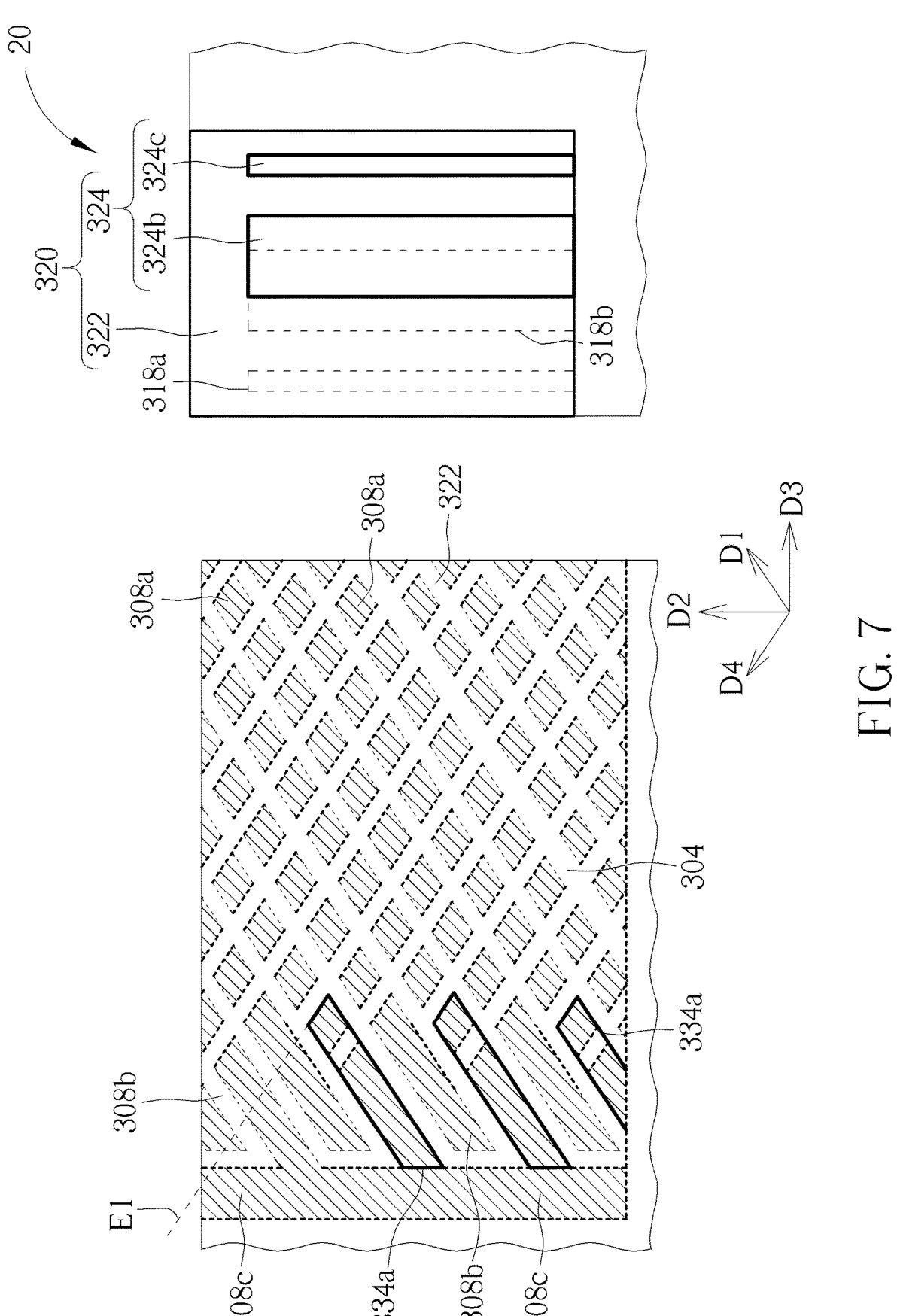
FIG. 7 is a schematic diagram illustrating a method of forming the semiconductor device according to an alternative embodiment of the present invention.

In addition, those of ordinary skill in the art would easily understand that for complying with practical needs, the semiconductor device according to the present invention may have a variety of embodiments in addition to the above-described ones. For example, in another embodiment, each of the first block patterns 334a may be made to cover entirely a corresponding one of the second mask patterns 308b in physical contact with the third mask pattern 308c, but partially cover the corresponding first mask patterns 308a, as shown in FIG. 7. For example, it only covers one of the first mask patterns 308a adjacent thereto. Each of the first block patterns 334a has a shorter side extending along an extension direction E1, e.g., a direction in parallel to the fourth direction D4. In the manufacturing methods according to alternative embodiments of the present invention (not shown), the first block patterns may be made to overlap entirely a corresponding one of the second mask patterns 308b in physical contact with the third mask pattern 308c, and one of the first mask patterns 308a adjacent thereto in the first direction D1. Alternatively, the first block patterns may be made to overlap entirely a corresponding one of the second mask patterns 308b in physical contact with the third mask pattern 308c, and partially overlap one of the first mask patterns 308a adjacent thereto in the first direction D1. Accordingly, in the above-described manufacturing methods, a specific extension pad may be elongated through an additional first blocking pattern, so that all the extension pads formed in the storage region can have complete contours. In this way, the method of forming a semiconductor device is beneficial to manufacturing a semiconductor device with improved component reliability and achieving excellent operational performance.

Figure 8:
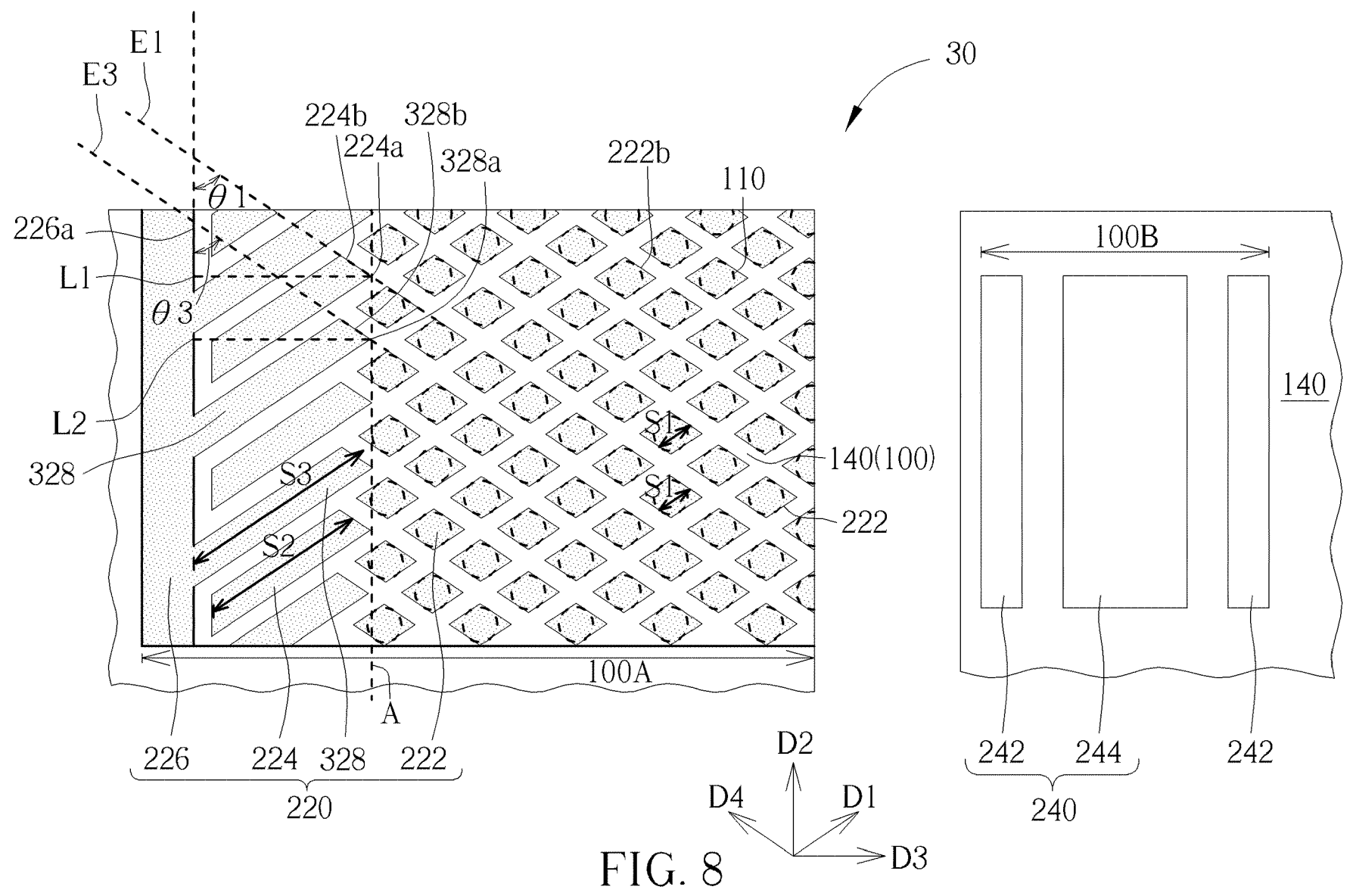

Please refer to FIG. 8, which is a schematic diagram illustrating a semiconductor device according to a third embodiment of the present invention. The structure of a semiconductor device 30 in this embodiment is similar to the structure of the semiconductor device 10 in the previous embodiment. The main difference is that, in this embodiment, a first included angle $\theta 1$ between a shorter side 224b of the second extension pad 224 and a lateral side 226a of the margin extension pad 226 nearest to the shorter side 224b is equal to a second included angle $\theta 3$ between a shorter side 328b of the third extension pad 328 and the lateral side 226a of the margin extension pad 226.

In detail, an extension direction E1 of the shorter side 224b and an extension direction E3 of the shorter side 328b are, for example, both in parallel to the fourth direction D4. Meanwhile, a shorter side 222b of the first extension pad 222 may also extend along a direction in parallel to the fourth direction D4, as shown in FIG. 8, but it is not limited thereto. In addition, a length S2 of the second extension pad 224 extending in the first direction D1 is also less than a length S3 of the third extension pad 328 extending in the first direction D1. Furthermore, even though the second extension pad 224 and the third extension pad 328 have different extension lengths S2 and S3, their respective ends 224a and 328a can still be aligned with each other and lie in the same cut line A. Under this configuration, ends of at least some of the first extension pads 222 are also aligned with each other, and close to the shorter sides 224b of the second extension pad 224 and the shorter sides 328b of the third extension pad 328. In addition, a shorter side 222b of the first extension pad 222 is further aligned with the shorter side 224b of the second extension pad 224 or the shorter sides 328b of the third extension pad 328. Therefore, the first extension pads 222 may have complete contours.

In an embodiment, the method of forming the third extension pads 328 is generally similar to that illustrated in the previous embodiments. For example, after the two self-aligned reverse patterning processes are performed, the first block patterns 334a as shown in FIG. 7 are additionally formed. The first block patterns 334a cover entirely the second mask patterns 308b in physical contact with the third mask pattern 308c, and partially cover the first mask patterns 308a. For example, the first block patterns 334a may, but not limited to, cover only the first mask patterns 308a respectively adjacent thereto.

In the configuration of the semiconductor device 30 according to the third embodiment of the present invention, the extension length S3 of the third extension pads 328 may be extended in the first direction D1, so that the first extension pads 222 adjacent to the third extension pads 328 can have complete contours. Therefore, the semiconductor device 30 in this embodiment also has improved device reliability and achieves excellent operational performance. In a subsequent manufacturing process, a capacitor structure (not shown) electrically connected to the first extension pads 222 can be further arranged above the storage node pad structure 220 to form a dynamic random access memory device and achieve further improved device performance.

Figure 9:
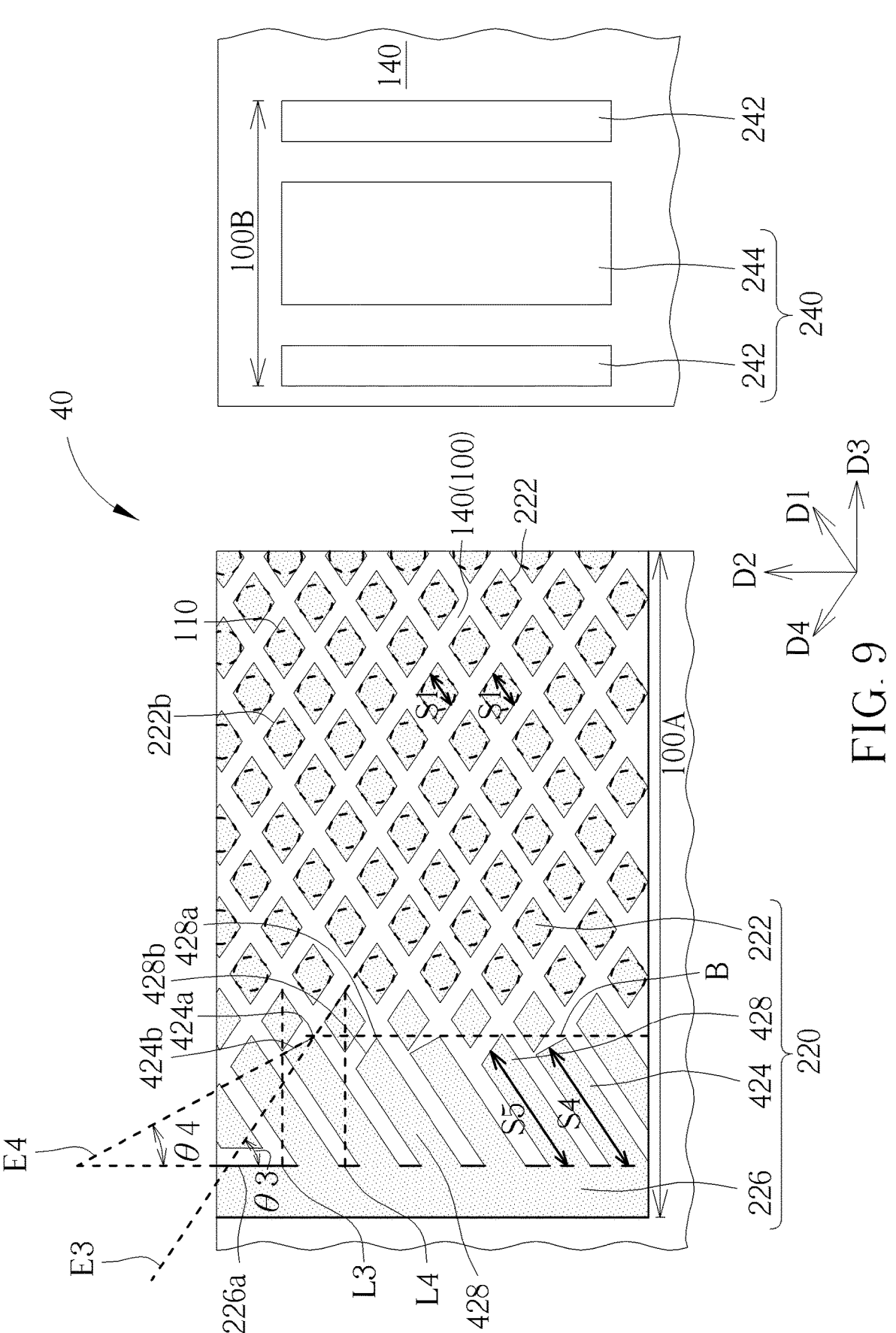
FIG. 9 is a schematic top view of a semiconductor device according to a fourth embodiment of the present invention.

Please refer to FIG. 9, which is a schematic diagram illustrating a semiconductor device according to a fourth embodiment of the present invention. The structure of a semiconductor device 40 in this embodiment is similar to the structure of the semiconductor device 30 in the previous embodiment. The main difference is that, in this embodiment, second extension pads 424 and third extension pads 428 are all in physical contact with the margin extension pad 226. Likewise, the third extension pads 428 and the second extension pads 424 are arranged alternately at an interval in the second direction D2.

In detail, a length S4 of the second extension pad 424 extending in the first direction D1 is greater than a length S5 of the third extension pad 428 extending in the first direction D1. Even though the second extension pad 424 and the third extension pad 428 have different extension lengths S4 and S5, their respective ends 424a and 428a can still be aligned with each other and lie in the same cut line B, as shown in FIG. 9. Furthermore, shorter sides 424b of the second extension pads 424 and the shorter sides 428b of the third extension pads 428 extend respectively in different directions E4 and E3. Accordingly, a first included angle $\theta 4$ between the shorter side 424b of the second extension pad 424 and the lateral side 226a of the margin extension pad 226 nearest to the shorter side 424b is not equal to a second included angle $\theta 3$ between the shorter side 428b of the third extension pad 428 and the lateral side 226a of the margin extension pad 226. The extending direction E3 of the shorter side 424b is, for example, parallel to the fourth direction D4, while the extending direction E4 of the shorter side 428b is neither parallel nor perpendicular to the fourth direction D4, as shown in FIG. 9.

However, it is not limited thereto. In this configuration, the maximum distance L3 from the end 424a of the second extension pads 424 to the lateral side 226a of the margin extension pad 226 is equal to the maximum distance L4 from the end 428a of the third extension pads 428 to the lateral side 226a of the margin extension pad 226. Furthermore, ends of at least some of the first extension pads 222 are also aligned with each other, and close to the shorter sides 424b of the second extension pad 424 and the shorter sides 428b of the third extension pad 428. Therefore, the first extension pads 222 may have complete contours.

In the configuration of the semiconductor device 40 according to the fourth embodiment of the present invention, the extension length S4 of the second extension pads 428 may be extended in the first direction D1. That is, in the process illustrated in FIG. 6, the first block patterns 324a do not cover the third mask pattern 308c and the second mask patterns 308b in contact with the third mask pattern 308c, but only cover the second mask patterns 308b, which are not in contact with the third mask pattern 308c. Accordingly, after the etching process, the ends 424a of the second extension pads 424 and the ends 428a of the third extension pads 428 can be aligned with each other, and the first extension pads 222 disposed adjacent to the second extension pads 424 can have complete contours. Therefore, the semiconductor device 40 in this embodiment also has improved device reliability and achieves excellent operational performance. In a subsequent manufacturing process, a capacitor structure (not shown) electrically connected to the first extension pads 222 can be further arranged above the storage node pad structure 220 to form a dynamic random access memory device and achieve further improved device performance.

Figure 10:
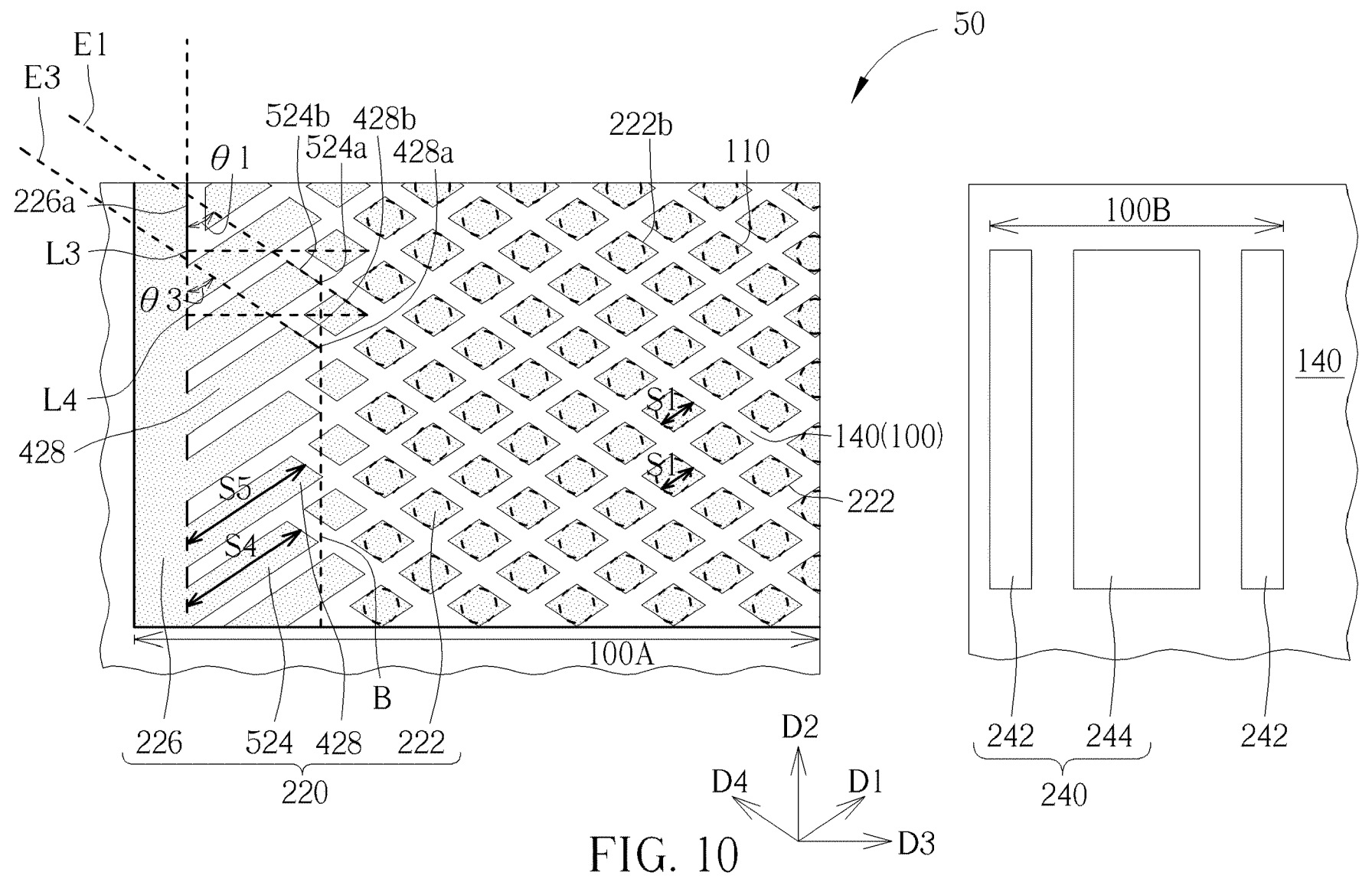

Please refer to FIG. 10, which is a schematic diagram illustrating a semiconductor device according to a fifth embodiment of the present invention. The structure of a semiconductor device 50 in this embodiment is similar to the structure of the semiconductor device 40 in the previous embodiment. The main difference is that, in this embodiment, a first included angle $\theta 1$ between a shorter side 524b of the second extension pad 524 and a lateral side 226a of the margin extension pad 226 nearest to the shorter side 524*b* is equal to a second included angle θ3 between a shorter side 428*b* of the third extension pad 428 and the lateral side 226*a* of the margin extension pad 226.

In detail, an extension direction E1 of the shorter side 524*b* and an extension direction E3 of the shorter side 428*b* are, for example, both in parallel to the fourth direction D4. Meanwhile, a shorter side 222*b* of the first extension pad 222 may also extend along a direction in parallel to the fourth direction D4, as shown in FIG. 10, but it is not limited thereto. In addition, a length S4 of the second extension pad 524 extending in the first direction D1 is also greater than a length S5 of the third extension pad 428 extending in the first direction D1. Furthermore, even though the second extension pad 524 and the third extension pad 428 have different extension lengths S4 and S5, their respective ends 524*a* and 428*a* can still be aligned with each other and lie in the same cut line B, as shown in FIG. 10. Under this configuration, ends of at least some of the first extension pads 222 are also aligned with each other, and close to the shorter sides 524*b* of the second extension pad 524 and the shorter sides 428*b* of the third extension pad 428. In addition, a shorter side 222*b* of the first extension pad 222 is further aligned with the shorter side 524*b* of the second extension pad 524 or the shorter sides 428*b* of the third extension pad 428. Therefore, the first extension pads 222 may have complete contours.

In the configuration of the semiconductor device 50 according to the fifth embodiment of the present invention, the extension length S4 of the second extension pads 524 may be extended in the first direction D1, so that the first extension pads 222 adjacent to the second extension pads 524 can have complete contours. Therefore, the semiconductor device 50 in this embodiment also has improved device reliability and achieves excellent operational performance. In a subsequent manufacturing process, a capacitor structure (not shown) electrically connected to the first extension pads 222 can be further arranged above the storage node pad structure 220 to form a dynamic random access memory device and achieve further improved device performance.

Generally, in a semiconductor device and a manufacturing method of the same according to the present invention, block patterns are additionally formed after the self-aligned reverse patterning process. Specific extension pads may be extended through the block patterns, so that the extension pads formed in the storage region would have complete contours without being affected by the photolithography process. Under this configuration, the semiconductor device according to the present invention can have improved device reliability and achieve excellent operational performance.

Those of ordinary skill in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a plurality of plugs disposed on the substrate; and
a storage node pad structure disposed on the substrate and comprising:
    a plurality of first extension pads separated from each other and arranged as an array, wherein the plurality of first extension pads are electrically connected with the plurality of plugs, respectively;
    a margin extension pad disposed outside the plurality of first extension pads;

a plurality of second extension pads disposed between the margin extension pad and the plurality of first extension pads; and
    a plurality of third extension pads disposed between the margin extension pad and the plurality of first extension pads, wherein a maximum distance from an end of one of the plurality of second extension pads to a lateral side of the margin extension pad, which is nearest to the end, is equal to a maximum distance from an end of one of the plurality of third extension pads to the lateral side of the margin extension pad, and wherein a first included angle between a shorter side of one of the plurality of second extension pads and the lateral side of the margin extension pad is less than 90 degrees, and a second included angle between a shorter side of one of the plurality of third extension pads and the lateral side of the margin extension pad is less than 90 degrees.

2. The semiconductor device according to claim 1, wherein the first included angle is not equal to the second included angle.

3. The semiconductor device according to claim 1, wherein a roughness of sidewalls of the plurality of third extension pads is higher than a roughness of sidewalls of the plurality of second extension pads.

4. The semiconductor device according to claim 1, wherein the plurality of second extension pads are not in contact with the margin extension pad, the plurality of third extension pads are in physical contact with the margin extension pad, and the plurality of third extension pads and the plurality of second extension pads are alternately arranged in a second direction.

5. The semiconductor device according to claim 4, wherein a length of each of the plurality of second extension pads in a first direction is smaller than a length of each of the plurality of third extension pads in the first direction.

6. The semiconductor device according to claim 1, wherein the plurality of second extension pads and the plurality of third extension pads are all in physical contact with the margin extension pad, and a length of each of the plurality of second extension pads in a first direction is greater than a length of each of the plurality of third extension pads in the first direction.

7. The semiconductor device according to claim 6, wherein the plurality of third extension pads and the plurality of second extension pads are alternately arranged in a second direction.

8. The semiconductor device according to claim 1, wherein a width of each of the plurality of third extension pads in a second direction is greater than a width of each of the plurality of second extension pads in the second direction.

9. The semiconductor device according to claim 1, wherein the shorter side of the one of the plurality of third extension pads and the shorter side of the one of the plurality of second extension pads are aligned with lateral sides of corresponding adjacent ones of the plurality of the first extension pads, respectively.

10. The semiconductor device according to claim 1, wherein the shorter side of the one of the plurality of second extension pads is close to one of the plurality of first extension pads.

11. The semiconductor device according to claim 1, wherein the margin extension pad comprises at least one border extending in a second direction, and the plurality of third extension pads are in physical contact with the at least one border.

12. The semiconductor device according to claim 11, further comprising:

a wiring structure disposed on the substrate in the peripheral region, the wiring structure and the storage node pad structure disposed in the storage region comprising the same metal material, wherein the wiring structure comprises:

a plurality of first conductive wires extending in parallel to each other in the second direction; and a plurality of second conductive wires extending in parallel to each other in the second direction, and alternately arranged with the plurality of first conductive wires in a direction perpendicular to the second direction; and a dielectric layer disposed on the substrate and surrounding the storage node pad structure and the wiring structure.

13. A method of forming a semiconductor device, comprising:

providing a substrate;

forming a plurality of plugs on the substrate; and forming a storage node pad structure on the substrate, the storage node pad structure comprising:

a plurality of first extension pads separated from each other and arranged as an array, wherein the plurality of first extension pads is electrically connected with the plurality of plugs, respectively;

a margin extension pad disposed outside the plurality of first extension pads;

a plurality of second extension pads disposed between the margin extension pad and the plurality of first extension pads; and a plurality of third extension pads disposed between the margin extension pad and the plurality of first extension pads, wherein a maximum distance from an end of one of the plurality of second extension pads to a lateral side of the margin extension pad, which is nearest to the end, is equal to a maximum distance from an end of one of the plurality of third extension pads to the lateral side of the margin extension pad, and wherein a first included angle between a shorter side of one of the plurality of second extension pads and the lateral side of the margin extension pad is less than 90 degrees, and a second included angle between a shorter side of one of the plurality of third extension pads and the lateral side of the margin extension pad is less than 90 degrees.

14. The method of forming a semiconductor device according to claim 13, wherein forming the storage node pad structure comprising:

forming a metal material layer on the plurality of plugs, overlying a storage region and a peripheral region of the substrate;

forming a plurality of first mask patterns, a plurality of second mask patterns and a third mask pattern on the metal material layer in the storage region, the plurality of first mask patterns being separated from each other and arranged as an array in a first direction, and the plurality of first mask patterns being aligned with the plurality of plugs, respectively; and forming a first block pattern on the metal material layer in the storage region, the first block pattern overlapping one of the plurality of first mask patterns, one of the plurality of second mask patterns and the third mask pattern, which are adjacent to each other in the first direction; and performing an etching process to etch the metal material layer through the plurality of first mask patterns, the plurality of second mask patterns, the third mask pattern and the first block pattern, thereby forming the storage node pad structure in the storage region.

15. The method of forming a semiconductor device according to claim 14, wherein a width of the first block pattern is greater than a width of the one of the plurality of first mask patterns.

16. The method of forming a semiconductor device according to claim 14, wherein the first block pattern overlaps entirely the one of the plurality of first mask patterns and the one of the plurality of second mask patterns, and the one of the plurality of second mask patterns is in physical contact with the third mask pattern.

17. The method of forming a semiconductor device according to claim 14, wherein the first block pattern overlaps partially one of the plurality of first mask patterns and overlaps entirely the one of the plurality of second mask patterns, and the one of the plurality of second mask patterns is in physical contact with the third mask pattern.

18. The method of forming a semiconductor device according to claim 14, wherein the first block pattern overlaps entirely the one of the plurality of first mask patterns and the one of the plurality of second mask patterns, and the one of the plurality of second mask patterns is not in physical contact with the third mask pattern.

19. The method of forming a semiconductor device according to claim 14, wherein the first block pattern overlaps partially one of the plurality of first mask patterns and overlaps entirely the one of the plurality of second mask patterns, and the one of the plurality of second mask patterns is not in physical contact with the third mask pattern.

20. The method of forming a semiconductor device according to claim 14, further comprising:

forming a second block pattern on the metal material layer in the peripheral region;

additionally forming a wiring structure in the peripheral region by etching the metal material layer through the second block pattern in the etching process, the wiring structure comprising:

a plurality of first conductive wires extending in parallel to each other in a second direction; and a plurality of second conductive wires extending in parallel to each other in the second direction and alternately arranged with the plurality of first conductive wires, wherein the wiring structure and the storage node pad structure comprise the same metal material; and forming a dielectric layer on the substrate after the storage node pad structure and the wiring structure are formed, the dielectric layer surrounding the storage node pad structure and the wiring structure.

* * * * *